(12) United States Patent
Charles (10) Patent No.: US 12,027,568 B2
(45) Date of Patent: Jul. 2, 2024

(54) MULTI-COLOUR ELECTROLUMINESCENT DISPLAY DEVICE AND METHOD FOR MANUFACTURING SUCH A DEVICE

(71) Applicant: Commissariat à l'Énergie Atomique et aux Énergies Alternatives, Paris (FR)

(72) Inventor: Matthew Charles, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 518 days.

(21) Appl. No.: 17/299,744

(22) PCT Filed: Dec. 3, 2019

(86) PCT No.: PCT/FR2019/052907
§ 371 (c)(1),
(2) Date: Jun. 3, 2021

(87) PCT Pub. No.: WO2020/115426
PCT Pub. Date: Jun. 11, 2020

(65) Prior Publication Data
US 2022/0020810 A1    Jan. 20, 2022

(30) Foreign Application Priority Data
Dec. 5, 2018   (FR) ...................... 1872366

(51) Int. Cl.
*H01L 33/00*    (2010.01)
*H01L 27/15*    (2006.01)
(Continued)

(52) U.S. Cl.
CPC ........ *H01L 27/156* (2013.01); *H01L 33/0075* (2013.01); *H01L 33/20* (2013.01); *H01L 33/32* (2013.01); *H01L 33/50* (2013.01)

(58) Field of Classification Search
CPC ... H01L 27/156; H01L 33/0075; H01L 33/20; H01L 33/30; H01L 33/32
See application file for complete search history.

(56) References Cited

U.S. PATENT DOCUMENTS

2003/0141512 A1    7/2003  Bruderl et al.
2013/0214251 A1*   8/2013  Balkenende ............ H01L 33/04
                                                        438/47

FOREIGN PATENT DOCUMENTS

EP    2 636 078 B1    12/2015

OTHER PUBLICATIONS

International Preliminary Report on Patentability for International Application No. PCT/FR2019/052907, dated Jun. 17, 2021.
(Continued)

*Primary Examiner* — Reema Patel
(74) *Attorney, Agent, or Firm* — Wolf, Greenfield & Sacks, P.C.

(57) ABSTRACT

A device including first and second light-emitting cells respectively emitting in first and second wavelength ranges, wherein:
  each cell includes a stack of a first layer of a first semiconductor material and of a second layer of a second semiconductor material having a different mesh parameter;
  in the first cell, the first layer is in contact with the second layer across the entire surface of the cell; and
  in the second cell, a mask provided with a plurality of through nano-openings forms an interface between the first layer and the second layer, the second layer comprising a plurality of nanopillars of the second material arranged in the nano-openings of the mask, and a
(Continued)

coalesced layer extending across substantially the entire surface of the cell on the side of the mask opposite to the first layer.

12 Claims, 5 Drawing Sheets

(51) Int. Cl.
*H01L 33/20* (2010.01)
*H01L 33/32* (2010.01)
*H01L 33/50* (2010.01)

(56) References Cited

OTHER PUBLICATIONS

International Search Report and Written Opinion for International Application No. PCT/FR2019/052907, dated Mar. 26, 2020.
Polyakov et al., Properties of undoped GaN/InGaN multi-quantum-wells and GaN/InGaN p—n junctions prepared by epitaxial lateral overgrowth. Journal of Applied Physics. Jun. 15, 2009;105(12):123708.

* cited by examiner (A)

MULTI-COLOUR ELECTROLUMINESCENT DISPLAY DEVICE AND METHOD FOR MANUFACTURING SUCH A DEVICE

This application is a national stage filing under 35 U.S.C. § 371 of International Patent Application Serial No. PCT/FR2019/052907, filed Dec. 3, 2019, which claims priority to French patent application FR18/72366, filed Dec. 5, 2018. The contents of these applications are incorporated herein by reference in their entireties.

TECHNICAL BACKGROUND

The present disclosure generally concerns light-emitting devices based on semiconductor materials and methods of manufacturing the same. It more particularly aims at the forming of a multi-color light-emitting display device, that is, comprising a plurality of pixels, among which pixels of different types are respectively capable of emitting light in different wavelength ranges.

PRIOR ART

A light-emitting display device conventionally comprises a plurality of pixels, each pixel being individually controllable to convert an electric signal into a light radiation. More particularly, each pixel comprises a light-emitting cell comprising a stack of a first doped semiconductor layer of a first conductivity type, of an active layer, and of a second doped semiconductor layer of the second conductivity type. In operation, an electric current is applied between the first and second semiconductor layers of the cell. Under the effect of this current, the active layer emits a light ray in a wavelength range which essentially depends on its composition. Each pixel may further comprise a control circuit, for example comprising one or a plurality of transistors, enabling to control the intensity of the current applied to the light-emitting cell of the pixel, and accordingly the intensity of the light radiation emitted by the pixel.

To enable to display multi-color images, the display device should comprise a plurality of pixels of different types capable of respectively emitting in different wavelength ranges.

To form a multi-color display device, a possibility is to transfer onto a same substrate pixels formed separately based on different semiconductor materials. The bonding and the alignment of the pixels on the transfer substrate may however be difficult to achieve. In particular, such a technique is not adapted to the forming of display devices having a small pitch between pixels, for example, smaller than 10 µm.

Another possibility is to form a display device where all the light-emitting cells of the pixels all emit in the same wavelength range, the light-emitting cells of certain pixels being coated with a color conversion layer, for example, a layer incorporating quantum dots or nanophosphors, capable of converting the light radiation emitted by the light-emitting cell into a light radiation in another wavelength range. The local deposition of color conversion layers may however be difficult to perform. Further, the lifetime of certain materials is relatively limited.

Another possibility is to successively form the light-emitting cells of the pixels of different types during distinct local epitaxy sequences, by modifying for each sequence the composition of the deposited layers to obtain pixels with a direct emission in different wavelength ranges. A disadvantage of this method however is its high cost, due to the implementation of a plurality of successive epitaxy sequences to successively form the light-emitting cells of the different types of pixels.

SUMMARY

There is a need for a multi-color light-emitting display device and for a method of manufacturing such a device, overcoming all or part of the disadvantages of known solutions.

Thus, an embodiment provides a light-emitting device comprising first and second light-emitting cells capable of respectively emitting in first and second wavelength ranges, wherein:

each light-emitting cell comprises a stack of a first layer of a first semiconductor material and of a second layer of a second semiconductor material having a mesh parameter different from that of the first material;

in the first cell, the first layer is in contact with the second layer across substantially the entire surface of the cell; and in the second cell, a mask provided with a plurality of through nano-openings regularly distributed across the entire surface of the cell forms an interface between the first layer and the second layer, the second layer comprising a plurality of nanopillars of the second material arranged in the nano-openings of the mask, in contact, by a first surface, with the first layer, and a coalesced layer of the second material in contact with a second surface of the nanopillars opposite to the first layer, extending across substantially the entire surface of the cell on the side of the mask opposite to the first layer.

According to an embodiment, in each cell, the first layer is doped with a first conductivity type, the second layer is topped with an active layer, and the active layer is topped with a doped semiconductor layer of the second conductivity type.

According to an embodiment, the first layer is made of gallium nitride and the second layer is made of indium gallium nitride.

According to an embodiment, the device comprises a third light-emitting cell identical to the first cell, wherein the third cell is topped with a wavelength conversion element, and the first and second cells are not topped with wavelength conversion elements.

According to an embodiment, the device further comprises a third light-emitting cell adapted to emitting in a third wavelength range, wherein:

the third light-emitting cell comprises a stack of a first layer of the first semiconductor material and of a second layer of the second semiconductor material;

in the third cell, a mask provided with a plurality of through nano-openings regularly distributed across the entire surface of the cell forms an interface between the first layer and the second layer;

the thickness of the mask is larger in the third cell than in the second cell; and the thickness of the second layer is greater than the thickness of the mask in the second cell and smaller than the thickness of the mask in the third cell.

According to an embodiment, each cell further comprises a third layer of a third semiconductor material topping the second layer, wherein:

in each of the first and second cells, the third layer is in contact with the second layer across substantially the entire surface of the cell; and in the third cell, the third layer comprises a plurality of nanopillars arranged in the nano-openings of the mask, in contact, by a first surface, with the second layer, and a coalesced layer of the material of the third layer in contact with a second surface of the nanopillars opposite to the second layer, extending across substantially the entire surface of the cell on the side of the mask opposite to the first layer.

According to an embodiment, the third material has a mesh parameter difference with the second material, the mesh parameter difference between the second material and the third material being greater than the mesh parameter difference between the first material and the third material.

According to an embodiment, the first, second, and third layers are respectively made of gallium nitride, of aluminum gallium nitride, and of indium gallium nitride.

According to an embodiment, the first, second, and third layers are respectively made of gallium nitride, of indium gallium nitride, and of indium gallium nitride, the compositions of the second and third indium gallium nitride layers being different.

According to an embodiment, the device further comprises a third light-emitting cell adapted to emitting in a third wavelength range, wherein:
the third light-emitting cell comprises a stack of a first layer of the first semiconductor material and of a second layer of the second semiconductor material;
in the third cell, a mask provided with a plurality of through nano-openings regularly distributed across the entire surface of the cell forms an interface between the first layer and the second layer;
the dimensions of the nano-openings of the mask are greater in the third cell than in the first cell.

Another embodiment provides a method of manufacturing a device such as defined hereabove, wherein the second layers of the different cells are simultaneously formed during a same epitaxy step.

According to an embodiment, the active layers of the different cells are formed simultaneously during a same epitaxy step.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the forming of the light-emitting cells of the pixels of a multi-color light-emitting display device is more particularly considered. The forming of the pixel control circuits and of possible structures of insulation between the light-emitting cells of the pixels and/or of connection of the light-emitting cells to the pixel control circuits has not been detailed, the described embodiments being compatible with the usual forming of these elements.

Unless specified otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings, it being understood that, in practice, the described devices may be oriented differently.

Unless specified otherwise, the expressions "around", "approximately", "substantially" and "in the order of" signify within 10%, and preferably within 5%.

FIGS. 1 to 6 illustrate successive steps of an example of a method of manufacturing a multi-color light-emitting display device according to a first embodiment.

The forming of a display device comprising three types of different pixels, capable of respectively emitting in three different wavelength ranges, is considered herein as an example. More particularly, it is desired in the present example to form a display device comprising one or a plurality of pixels of a first type, called blue pixels, capable of mainly emitting blue light, for example, in a wavelength range from 400 to 490 nm, one or a plurality of pixels of a second type, called green pixels, capable of mainly emitting green light, for example, in a wavelength range from 490 to 570 nm, and one or a plurality of pixels of a third type, called red pixels, capable of mainly emitting red light, for example, in a wavelength range from 570 to 710 nm. In FIGS. 1 to 6, a single blue pixel B, a single green pixel G, and a single red pixel R are shown, it being understood that, in practice, the display device may comprise a plurality of pixels of each type, the pixels of a same type being identical or similar to within manufacturing dispersions. As an example, the light-emitting cells of pixels R, G, and B have, in top view, the same general shape, for example, a square or rectangular shape, and the same lateral dimensions, for example, in the range from 1 to 20 µm, and preferably from 5 to 10 µm. The described embodiments are however not limited to this specific case.

In this example, in each pixel, the active layer of the light-emitting cell of the pixel comprises confinement means corresponding to multiple quantum wells. More particularly, the active layer comprises an alternation of semiconductor layers of a first material and of semiconductor layers of a second material, each layer of the first material being sandwiched between two layers of the second material, the first material having a bandgap narrower than that of the second material.

As an example, each of the first and second materials mainly comprises a III-V compound comprising at least a first group-III element, a second group-V element, and, possibly, a third element, for example, a group-III element other than the first element.

Examples of group-III elements comprise gallium (Ga), indium (In), or aluminum (Al). Examples of group-V elements comprise nitrogen, phosphorus, or arsenic. Examples of binary and ternary III-V compounds are GaN, AlN, InN, InGaN, AlGaN, or AlInGaN. Generally, the elements in the III-V compound may be combined with different molar fractions.

In a preferred embodiment, the first material is InGaN and the second material is GaN or InGaN having an indium concentration lower than that of the first material.

According to an aspect of an embodiment, it is provided to simultaneously form the light-emitting cells of the three types of pixels, during a same epitaxy step sequence.

Figure 1:
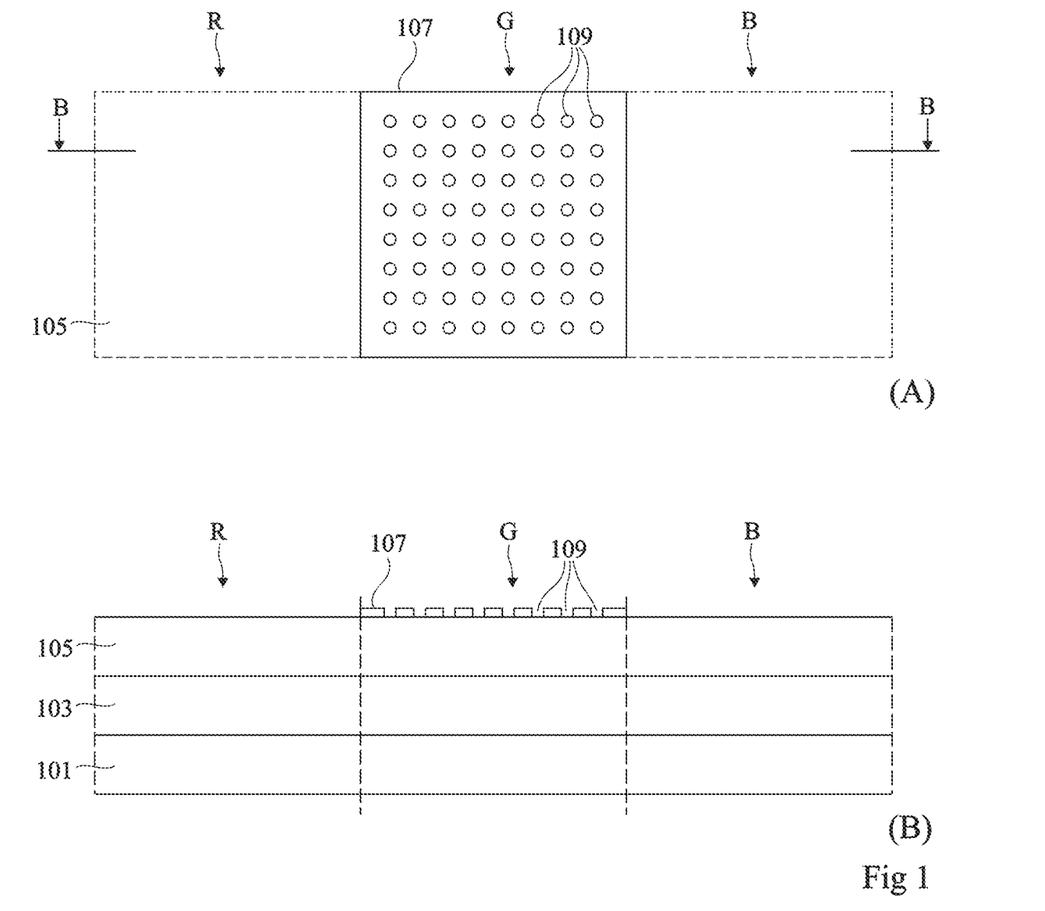
FIG. 1 illustrates a step of a method of manufacturing a light-emitting display device according to a first embodiment.

FIG. 1 comprises a top view (A) and a cross-section view (B) along plane B-B of view (A) of an initial structure comprising a growth substrate 101, for example, made of sapphire ($Al_2O_3$), of silicon carbide (SiC), of silicon (Si), of gallium nitride (GaN), or of aluminum nitride (AlN), a stack 103 of one or a plurality of buffer layers on top of and in contact with the upper surface of growth substrate 101, and a crystalline N-type doped gallium nitride (GaN) layer 105 on top of and in contact with the upper surface of stack 103. As an example, the stack of buffer layers 103 is formed by epitaxy on the upper surface of substrate 101, and layer 105 is formed by epitaxy on the upper surface of stack 103. In this example, stack 103 extends continuously and has a substantially uniform thickness over the entire surface of substrate 101, and layer 105 extends continuously and has a substantially uniform thickness over the entire surface of stack 103. The thickness of stack 103 is for example in the range from 0.5 to 10 µm. The thickness of layer 105 is for example in the range from 0.5 to 10 µm.

FIG. 1 more particularly illustrates a step of forming of a mask 107 on the upper surface of layer 103. The mask is for example made of a dielectric material, for example, of silicon nitride or of silicon oxide. In this example, mask 107 is located opposite the green pixels G of the device only, that is, it does not cover the light-emitting cells of the red pixels R or the light-emitting cells of the blue pixels B of the device. Opposite each green pixel G, mask 107 comprises a plurality of through nano-openings 109, identical or similar, for example, of cylindrical shape, regularly distributed across the entire surface of the light-emitting cell of the pixel. Nan-openings here means openings having lateral dimensions (width or diameter) smaller than one micrometer. Through here means that openings 109 vertically thoroughly cross mask 107. As an example, each of openings 109 has a lateral dimension (width or diameter) in the range from 10 to 100 nm, preferably from 20 to 50 nm. The repetition pitch of openings 109 (distance from center to center between two neighboring openings in top view) is for example smaller than 200 nm, preferably smaller than 100 nm, for example, in the range from 20 to 80 nm. As an example, openings 109 each have a lateral dimension in the order of 25 nm, and the repetition pitch of the openings is in the order of 40 nm. The thickness of mask 107 is for example in the range from 10 to 100 nm, preferably from 10 to 30 nm, for example in the order of 20 nm. In the show example, mask 107 has, in top view, a generally square shape and has a square symmetry. The described embodiments are not limited to this specific example. As a variant, mask 107 may have, in top view, a generally hexagonal shape and have a hexagonal symmetry.

In a preferred embodiment, to form openings 109 of mask 107, a film (not shown) of controlled porosity based on block copolymers is deposited on the upper surface of a continuous layer of the masking material, after which mask 107 is etched opposite the pores of the copolymer film to form openings 109. The copolymer film is thus used as a mask for the etching of openings 109. Once the etching of openings 109 has been performed, the copolymer film may be removed. An example of implementation of such a method is for example described in the article entitled "Density Multiplication and Improved Lithography by Directed Block Copolymer Assembly" of Ricardo Ruiz et al (Science 15 Aug. 2008: Vol. 321, Issue 5891, pp. 936-939). An advantage of such a method is that it enables to rapidly form a large number of openings 109 of small dimensions spaced apart in mask 107.

As a variant, the openings 109 of mask 107 are formed by electron beam lithography.

As an example, the forming of mask 107 may comprise a step of deposition of a masking layer extending continuously over the entire surface of the device, followed by a step of forming, in the masking material, of openings 109 regularly distributed across the entire surface of the device, followed by a step of local removal of the mask to only keep the mask opposite the green pixels G of the device.

Figure 2:
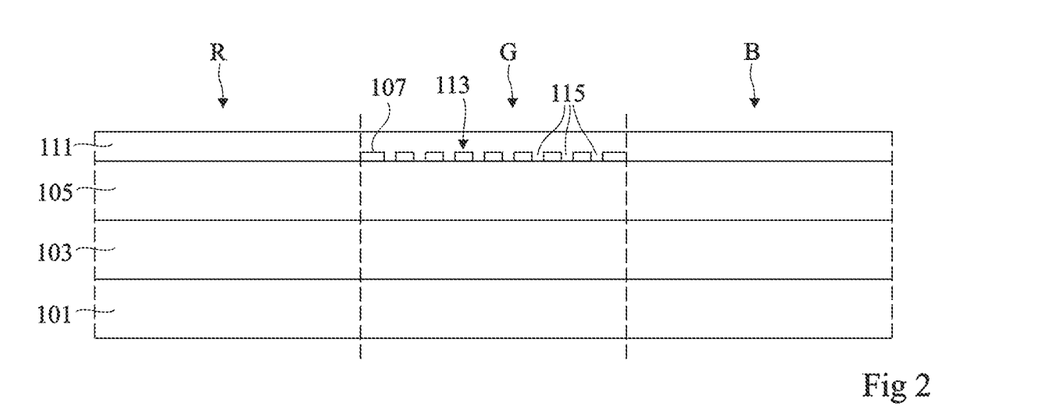
FIG. 2 illustrates another step of a method of manufacturing a light-emitting display device according to the first embodiment.

FIG. 2 is a cross-section view in the same plane as view (B) of FIG. 1, illustrating a step of deposition, by epitaxy, of a layer 111 of an N-type doped semiconductor material on the upper surface of the structure obtained at the end of the steps of FIG. 1. During this step, the epitaxial growth is performed from the unmasked portions of the upper surface of layer 105. Thus, in red and blue pixels R and B, the epitaxial growth is performed uniformly across the entire surface of the light-emitting cells of the pixels, and, in green pixels G, the epitaxial growth is only performed from the portions of the upper surface of layer 105 located at the bottom of the openings 109 of mask 107. The epitaxy is performed simultaneously in all the pixels of the device. The epitaxy is for example performed by MOCVD ("MetalOrganic Chemical Vapor Deposition") or by MBE ("Molecular Beam Epitaxy").

Layer 111 is deposited across a thickness greater than the thickness of mask 107, so that, opposite each green pixel G, layer 111 comprises, in its upper portion, a coalesced layer 113 continuously extending over the entire surface of the light-emitting cell of the pixel. As an example, the thickness of layer 111 at the end of the deposition step of FIG. 2 is in the range from 20 to 100 nm. At the end of the deposition step of FIG. 2, in each red R or blue B pixel of the device, layer 111 is a substantially planar layer continuously extending across a substantially uniform thickness over the entire surface of the light-emitting cell of the pixel and, in each green pixel G of the device, layer 111 comprises:

- a lower portion formed of nanopillars 115 of the semiconductor material, filling openings 109 of mask 107, each nanopillar 115 being in contact, by its lower surface, with layer 105; and
- an upper portion formed by the coalesced layer 113 of the semiconductor material, layer 113 being substantially planar and continuously extending across a substantially uniform thickness over the entire surface of the light-emitting cell of the pixel, and being in contact, by its lower surface, with the upper surface of nanopillars 115 and with the upper surface of mask 107.

The semiconductor material of layer 111 has a mesh parameter different from that of layer 105. In this example, layer 105 is made of gallium nitride (GaN) and layer 111 is made of indium gallium nitride (InGanN). Due to the mesh parameter difference between the materials of layers 105 and 111, and due to the relatively small thickness of layer 111 with respect to layer 105, layer 111 is, on its upper surface side, relatively strongly strained opposite the red R and blue B pixels of the device. In the green pixels G of the device, due to the presence of nanostructures on the lower surface side of layer 111, at the interface with layer 105, layer 111 is however relatively lightly strained or even relaxed on its upper surface side.

Figure 3:
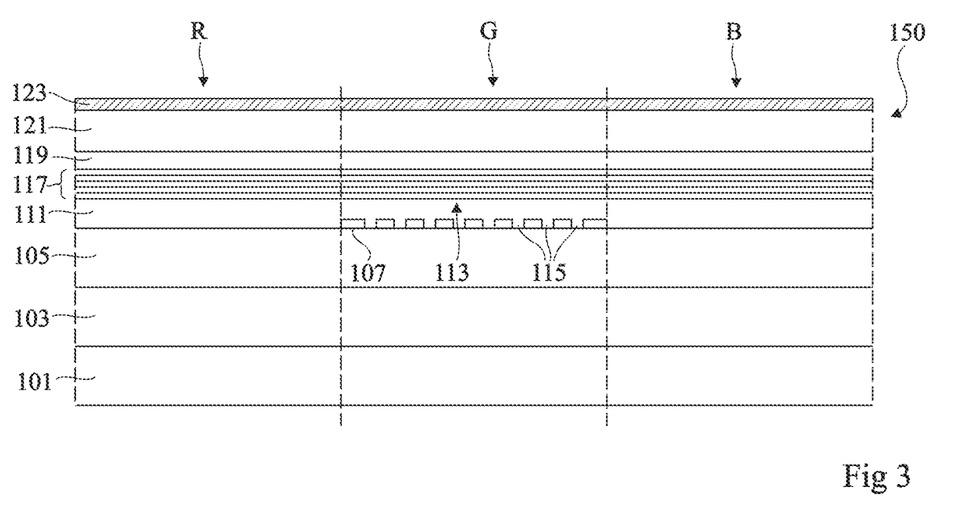
FIG. 3 illustrates another step of a method of manufacturing a light-emitting display device according to the first embodiment.

FIG. 3 is a cross-section view in the same plane as view (B) of FIG. 2, illustrating a step of deposition, by epitaxy, of an active layer 117 in the red, green, and blue, R, G, and B pixels of the device. During this step, the epitaxial growth is performed from the upper surface of layer 111. The epitaxy is performed simultaneously in all the device pixels. The epitaxy is for example performed by MOCVD. During this step, an alternation of semiconductor layers of a first material, for example, InGaN, and of semiconductor layers of a second material having a wider bandgap than that of the first material, for example, GaN or InGaN having an indium concentration lower than that of the first material, is deposited, to form a stack of quantum wells, for example, a stack of from 3 to 10 quantum wells. As an example, the total thickness of active layer 117 is in the range from 40 to 150 nm. In each pixel of the device, active layer 117 is a substantially planar layer continuously extending across a substantially uniform thickness over the entire surface of the light-emitting cell of the pixel. The thickness of active layer 117 is for example substantially the same in all pixels of the device. However, due to the strain difference in the upper portion of layer 111 between red and blue pixels R and B on the one hand, and green pixels G on the other hand, the indium concentration in each InGaN layer of active layer 117 is not the same in pixels R and B as in pixels G. More particularly, a lower indium concentration is obtained in pixels R and B than in pixels G. This concentration difference originates from the fact that, during a single epitaxy step, indium incorporates more easily in a relatively lightly-strained or even relaxed layer than in a relatively strongly strained layer. This enables to obtain different emission wavelength ranges in the light-emitting cells of pixels R and B on the one hand, and in the light-emitting cells of pixels G on the other hand. More particularly, in this example, the growth conditions of active layer 117 are selected to obtain an emission mainly in blue in the light-emitting cells of pixels R and B, and an emission mainly in green in the light-emitting cells of pixels G.

FIG. 3 further illustrates an optional step of deposition, in each pixel, of a layer 119 forming an electron barrier on top of and in contact with the upper surface of active layer 117. Layer 119 is for example a P-type doped aluminum gallium nitride layer (AlGaN). Layer 119 may be simultaneously deposited in all the pixels of the device. In each pixel of the device, layer 119 is a substantially planar layer continuously extending across a substantially uniform thickness over the entire surface of the light-emitting cell of the pixel. The thickness of layer 119 is for example substantially the same in all the device pixels, for example, in the range from 10 to 50 nm, for example in the order of 20 nm.

FIG. 3 further illustrates a step of deposition of a layer 121 of a P-type doped semiconductor material on top of and in contact with the upper surface of barrier layer 119. Layer 121 is for example a P-type doped gallium nitride layer (GaN). Layer 121 may be deposited simultaneously in all the device pixels. In each pixel of the device, layer 121 is a substantially planar layer continuously extending across a substantially uniform thickness over the entire surface of the light-emitting cell of the pixel. The thickness of layer 121 is for example substantially the same in all the pixels of the device, for example, in the range from 100 to 300 nm.

FIG. 3 further illustrates a step of deposition, in each pixel, of a conductive layer 123 on top of and in contact with the upper surface of P-type layer 121. Layer 123 may be simultaneously deposited in all the pixels of the device. In each pixel of the device, layer 123 is for example a substantially planar layer continuously extending across a substantially uniform thickness over the entire surface of the light-emitting cell of the pixel. The thickness of layer 123 is for example substantially the same in all the pixels of the device. In this example, layer 123 is a metal layer continuously extending over substantially the entire upper surface of the device obtained at the end of the previous steps.

Figure 4:
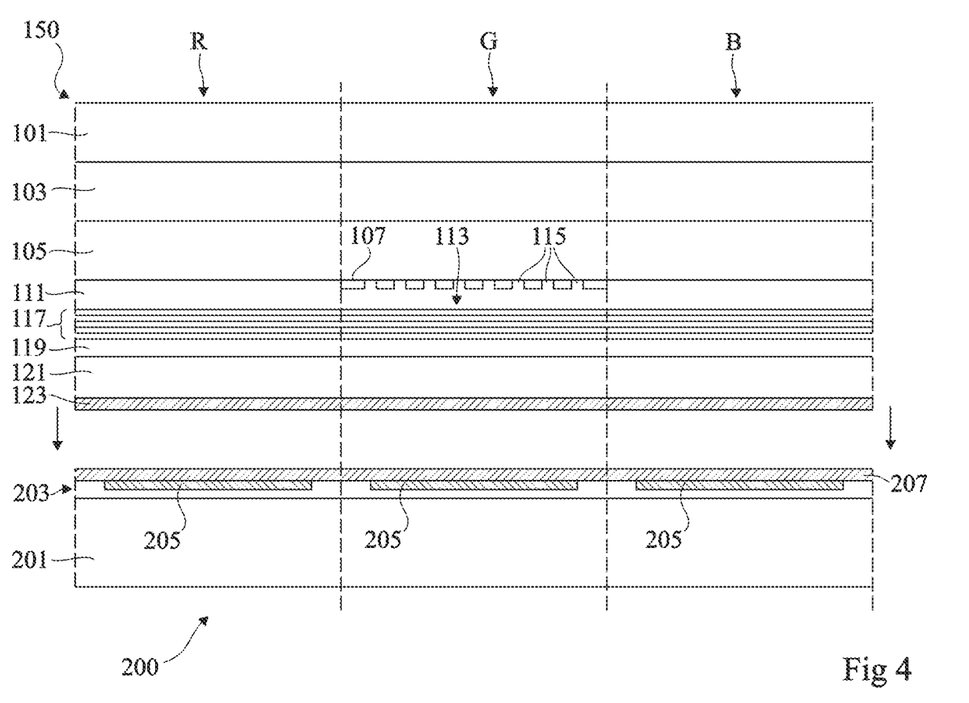
FIG. 4 illustrates another step of a method of manufacturing a light-emitting display device according to the first embodiment.

FIG. 4 illustrates a step of transfer of the structure 150 obtained at the end of the steps of FIGS. 1 to 3 onto an integrated circuit 200 comprising, for each pixel of the device, an elementary control circuit, for example, based on MOS transistors, enabling to individually control the current flowing through the light-emitting cell of the pixel, and accordingly the light intensity emitted by the cell. It should be noted that in FIG. 4, structure 150 is flipped with respect to the orientation of FIG. 3.

Integrated circuit 200 is formed inside and on top of a semiconductor substrate 201, for example, made of silicon, for example in CMOS technology. In this example, integrated circuit 200 comprises a stack 203 of insulating and conductive interconnection layers coating the upper surface of substrate 201. Interconnection stack 203 particularly comprises, for each pixel, a metal connection pad 205 flush with the upper surface of stack 203, connected to the elementary pixel control circuit. In this example, integrated circuit 200 further comprises a metal layer 207 extending continuously over substantially the entire upper surface of interconnection stack 203.

During the transfer step of FIG. 4, the lower surface (according to the orientation of FIG. 4) of the metal layer 123 of structure 150 is placed into contact with the upper surface of the metal layer 207 of circuit 200. Structure 150 and circuit 200 are for example fastened to each other by direct bonding or molecular bonding of metal layer 123 to metal layer 207.

Figure 5:
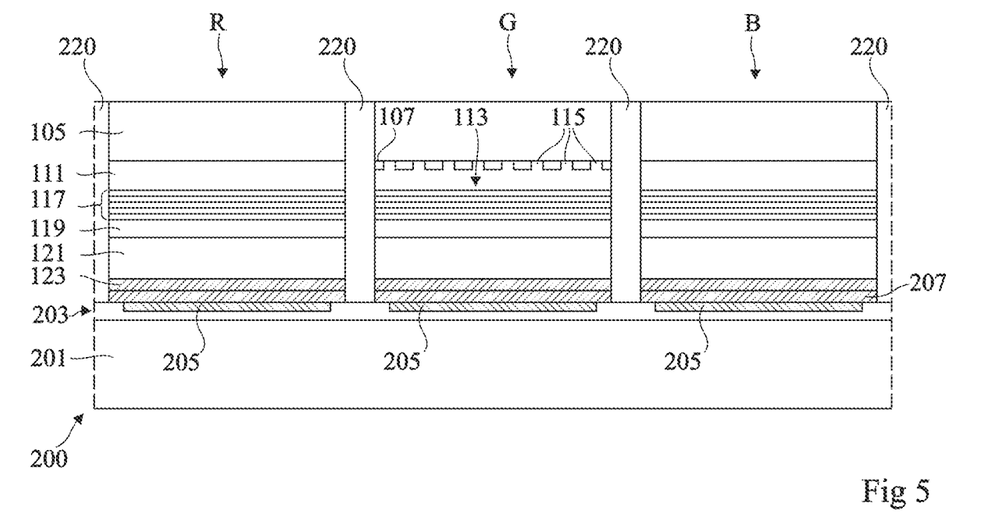
FIG. 5 illustrates another step of a method of manufacturing a light-emitting display device according to the first embodiment.

FIG. 5 illustrates a step subsequent to the transfer of structure 150 onto control circuit 200, during which growth substrate 101 and the stack of buffer layers 103 of structure 150 are removed to free the access to the upper surface (that is, the surface opposite to control circuit 200) of layer 105.

FIG. 5 further illustrates a step, subsequent to the removal of substrate 101 and of stack 103, of forming of trenches 220 insulating from one another the light-emitting cells of the different pixels of the device. In this example, trenches 220 extend vertically from the upper surface of layer 105 to the upper surface of interconnection stack 203. Trenches 220 may be totally or partially filled with an electrically-insulating material, for example, silicon oxide.

Figure 6:
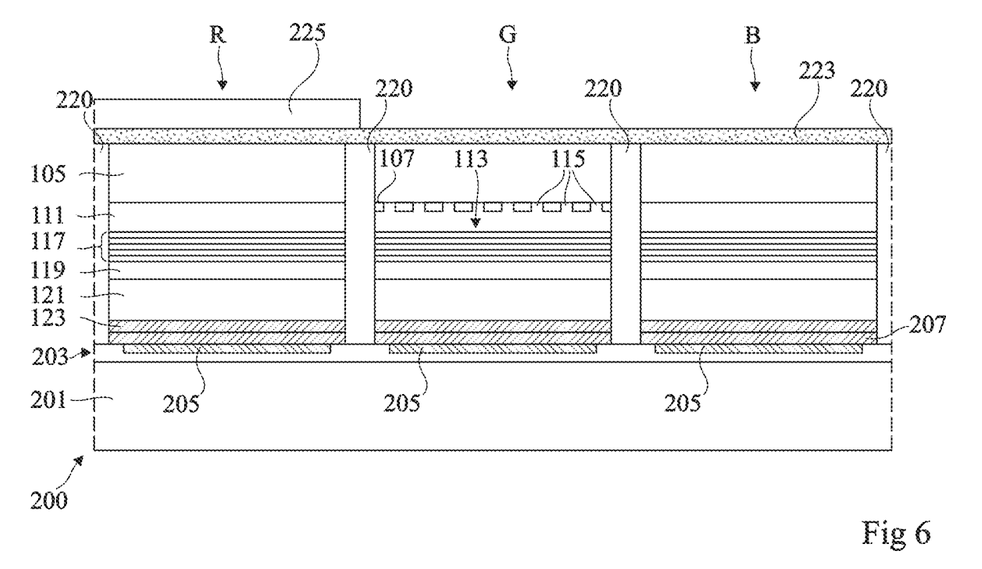
FIG. 6 illustrates another step of a method of manufacturing a light-emitting display device according to the first embodiment.

FIG. 6 illustrates a subsequent step of deposition of a conductive layer 223 onto the upper surface of the structure obtained at the end of the steps of FIGS. 1 to 5. In this example, layer 223 is a transparent conductive layer, for example, made of indium tin oxide (ITO), extending continuously over substantially the entire surface of the device. Layer 223 is in particular in contact, in each pixel, with the upper surface of the N-type semiconductor layer 105 of the light-emitting cell of the pixel. In this example, layer 223 enables to take a collective contact on the layers 105 of all the light-emitting cells of the device, an individual contact being taken on the P-type semiconductor layer 121 of each cell via pads 205 and metal layers 207 and 123.

FIG. 6 further illustrates a step of local deposition or transfer, opposite each red pixel R of the device, onto the upper surface of transparent conductive layer 223, of a color conversion element 225 adapted to converting the light radiation emitted by the light-emitting cell of pixel R into a light radiation in another wavelength range. In this example, element 225 is adapted to converting the blue light emitted by the light-emitting cell of pixel R into red light. Element 225 is for example formed of a layer incorporating quantum dots or nanophosphors.

An advantage of the method described in relation with FIGS. 1 to 6 is that it enables to simultaneously form, during a same sequence of epitaxy steps, two types of light-emitting cells adapted to respectively emitting in two different wavebands. This particularly enables to decrease the number of color conversion elements of different types to be provided to form a multi-color display device. In particular, in the above-described example, a single type of color conversion element is sufficient to form a three-color display device, which decreases the complexity of the device.

FIGS. 7 to 11 are cross-section views illustrating successive steps of an example of a method of manufacturing a multi-color light-emitting display device according to a second embodiment.

The forming of a display device comprising three types of different pixels, capable of respectively emitting in three different wavelength ranges, is considered herein as in the example of FIGS. 1 to 6. More particularly, it is desired in the example of FIGS. 1 to 6 to form a display device comprising one or a plurality of blue pixels B, adapted to mainly emitting blue light, one or a plurality of green pixels G, adapted to mainly emitting green light, and one or a plurality of red pixels R, adapted to mainly emitting red light.

Figure 7:
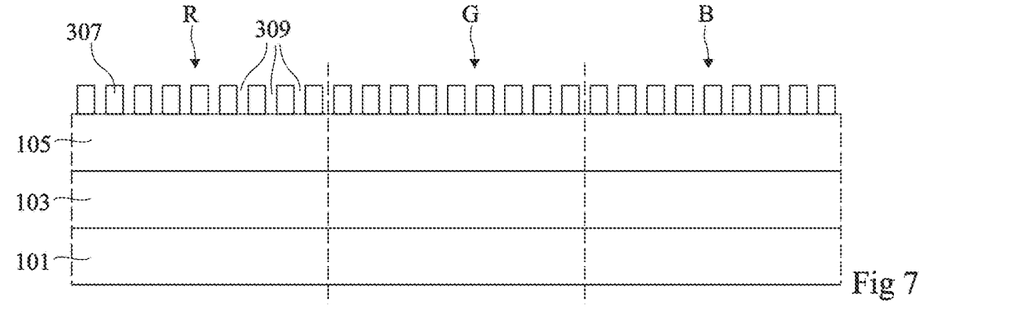
FIG. 7 illustrates a step of a method of manufacturing a light-emitting display device according to a second embodiment.

FIG. 7 shows an initial structure identical or similar to the structure of FIG. 1, comprising a growth substrate 101, a stack 103 of one or a plurality of buffer layers on top of and in contact with the upper surface of growth substrate 101, and an N-type doped gallium nitride (GaN) layer 105 on top of and in contact with the upper surface of stack 103.

FIG. 7 more particularly illustrates a step of forming of a mask 307 on the upper surface of layer 103. Mask 307 is for example made of a dielectric material, for example, of silicon nitride or of silicon oxide. Mask 307 is for example identical or similar to the mask 107 of FIG. 1, but for the fact that, in the example of FIG. 7, mask 307 extends on all the pixels R, G, and B of the device, and not only opposite green pixels G. Mask 307 comprises a plurality of through nano-openings 309, for example, identical or similar to the openings 109 of the mask 107 of FIG. 1, regularly distributed across the entire surface of the device.

Figure 8:
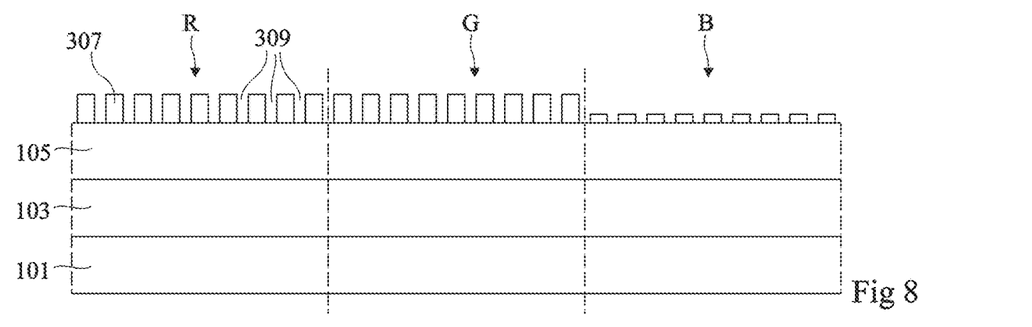
FIG. 8 illustrates another step of a method of manufacturing a light-emitting display device according to the second embodiment.

FIG. 8 illustrates a step of local thinning of mask 307 opposite the blue pixels B of the device. As an example, the thinning of mask 307 is performed by local vertical anisotropic etching. At the end of this step, the thickness of mask 307 opposite the blue pixels B is for example smaller by at least 10 nm than the thickness of mask 307 opposite pixels R and G.

Figure 9:
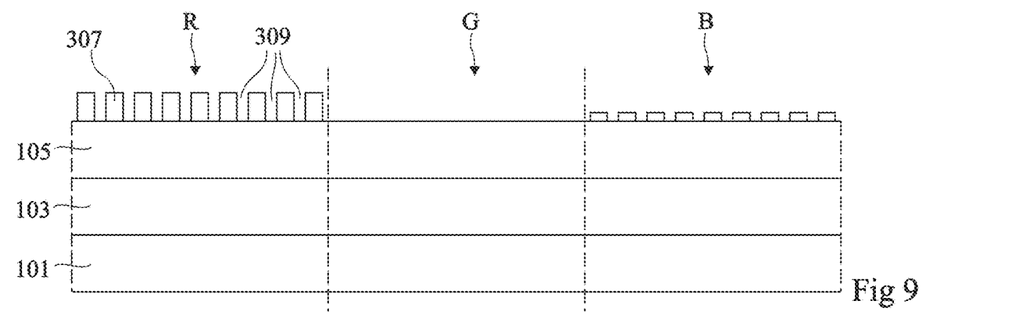
FIG. 9 illustrates another step of a method of manufacturing a light-emitting display device according to the second embodiment.

FIG. 9 illustrates a step of local removal 307 opposite the green pixels G of the device to keep the mask only opposite the red and blue pixels R and B of the device.

Figure 10:
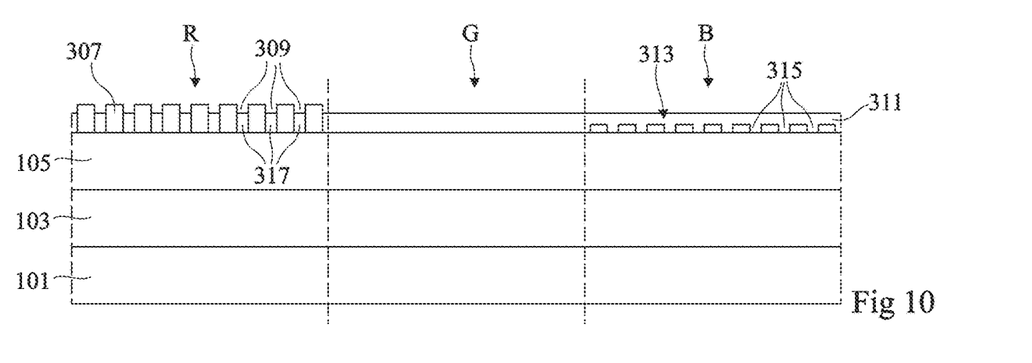
FIG. 10 illustrates another step of a method of manufacturing a light-emitting display device according to the second embodiment.

FIG. 10 illustrates a step of deposition by epitaxy of a layer 311 of an N-type doped semiconductor material onto the upper surface of the structure obtained at the end of the steps of FIGS. 7 to 9. During this step, the epitaxial growth is performed from the unmasked portions of the upper surface of layer 105. Thus, in green pixels G, the epitaxial growth is performed uniformly over the entire surface of the light-emitting cells of the pixels and, in the red and blue pixels R and B, the epitaxial growth is only performed from the portions of the upper surface of layer 105 located at the bottom of the openings 309 of mask 307. The epitaxy is performed simultaneously in all the pixels of the device, during a single epitaxy step. The epitaxy is for example performed by MOCVD.

Layer 311 is deposited across a thickness greater than the thickness of mask 307 opposite the blue pixels B of the device, and smaller than the thickness of mask 307 opposite the red pixels R. Thus, opposite each blue pixel B, layer 311 comprises, in its upper portion, a coalesced layer 313 extending continuously over the entire surface of the light-emitting cell of the pixel and, in its lower portion, a plurality of nanopillars 315 arranged in the openings 309 of mask 307 and coupling coalesced layer 313 to the upper surface of layer 105. In each green pixel G of the device, layer 311 is a substantially planar layer continuously extending across a substantially uniform thickness over the entire surface of the light-emitting cell of the pixel. In each red pixel R of the device, layer 311 is a discontinuous layer formed of nanopillars 317 arranged in the openings 309 of mask 307, extending from the upper surface of layer 105 and only partially filling openings 309.

The semiconductor material of layer 311 has a mesh parameter different from that of layer 105. In this example, layer 105 is made of gallium nitride (GaN) and layer 311 is made of aluminum gallium nitride (AlGanN). Due to the mesh parameter difference between the materials of layers 105 and 311, and due to the relatively small thickness of layer 311 with respect to layer 105, layer 311 is, on its upper surface side, relatively strongly strained opposite the green pixels G of the device. In the red and blue pixels R and B of the device, due to the presence of nanostructures on the lower surface side of layer 311, layer 311 is however relatively lightly strained or even relaxed on its upper surface side.

Figure 11:
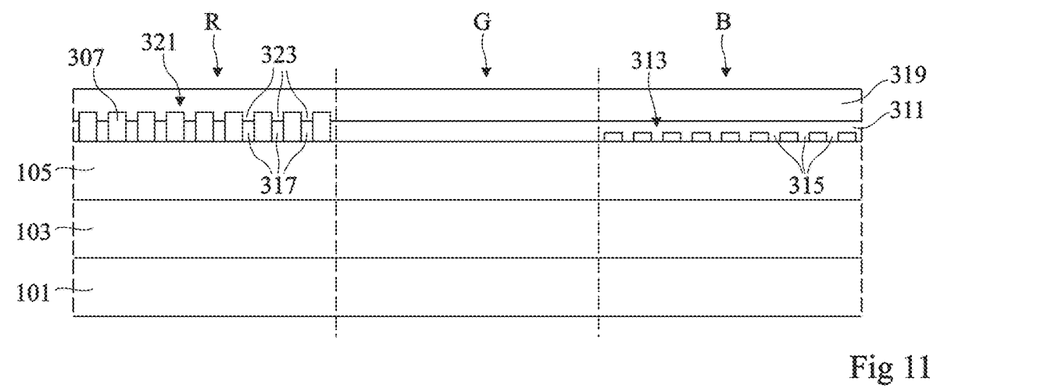
FIG. 11 illustrates another step of a method of manufacturing a light-emitting display device according to the second embodiment.

FIG. 11 illustrates a step of deposition by epitaxy of a layer 319 of an N-type doped semiconductor material onto the upper surface of the structure obtained at the end of the steps of FIGS. 7 to 10. During this step, the epitaxial growth is performed from the upper surface of layer 311. Thus, in the green and blue pixels G and B, the epitaxial growth is performed uniformly over the entire surface of the light-emitting cells of the pixels and, in the red pixels R, the epitaxial growth is only performed from the upper surface of nanopillars 317 located in the openings 309 of mask 307. The epitaxy is performed simultaneously in all the pixels of the device. The epitaxy is for example performed by MOCVD.

Layer 319 is deposited across a thickness greater than the height of the portions of the cavities 309 of mask 307 which are not filled with nanopillars 317 in the red pixels R of the device. Thus, opposite each red pixel R, layer 319 comprises, in its upper portion, a coalesced layer 321 extending continuously over the entire surface of the light-emitting cell of the pixel and, in its lower portion, a plurality of nanopillars 323 arranged in the openings 309 of mask 307 and coupling coalesced layer 321 to the upper surface of the nanopillars 317 of layer 311. In each green or blue pixel G or B of the device, layer 319 is a substantially planar layer continuously extending across a substantially uniform thickness over the entire surface of the light-emitting cell of the pixel.

The semiconductor material of layer 319 has a mesh parameter different from that of layer 311 and, preferably, different from that of layer 105. In this example, the mesh parameter difference between the material of layer 319 and the material of layer 311 is greater than between the material of layer 319 and the material of layer 105. In this example, layer 319 is made of gallium-indium nitride (InGaN).

In the blue pixels B of the device, layer 311 is lightly strained or even relaxed on its upper surface side. Due to the relatively high mesh parameter difference between the material of layer 311 and the material of layer 319, layer 319 is highly strained on its upper surface side in the blue pixels B of the device.

In the green pixels G of the device, since layer 311 is already strained on the mesh of layer 105, and since the mesh parameter difference between the material of layer 319 and the material of layer 105 is smaller than the mesh parameter difference between the material of layer 319 and the material of layer 311, layer 319 has, on its upper surface side, a lighter strain than in the blue pixels B of the device.

In the red pixels R of the device, due to the presence of nanostructures on the lower surface side of layer 319, at the interface with layer 311, layer 319 is however relatively lightly strained or even relaxed on its upper surface side.

The next steps of the display device manufacturing method (not detailed herein) are for example similar to what has been previously described in relation with FIGS. 3 to 6. Due to the strain differences of the upper portion of layer 319 between the red, green, and blue pixels R, G, and B, the indium concentration in each InGaN layer of the active layer is not the same in the R, G, and B pixels. More particularly, a lighter indium concentration is obtained in blue pixels B than in green pixels G, and in green pixels G than in red pixels R. This enables to obtain different wavelength ranges in the light-emitting cells of the different types of pixels. More particularly, in this example, the growth conditions of the active layer are selected to obtain an emission mainly in green in the light-emitting cells of pixels G, an emission mainly in blue in the light-emitting cells of pixels B, and an emission mainly in red in the light-emitting cells of pixels R.

Thus, an advantage of the manufacturing method described in relation with FIGS. 7 to 11 is that it enables to simultaneously form, during a same sequence of epitaxy steps, three types of light-emitting cells adapted to respectively emitting in three different wavebands. This particularly enables to totally do away with color conversion elements in the case of a three-color display device.

Figure 12:
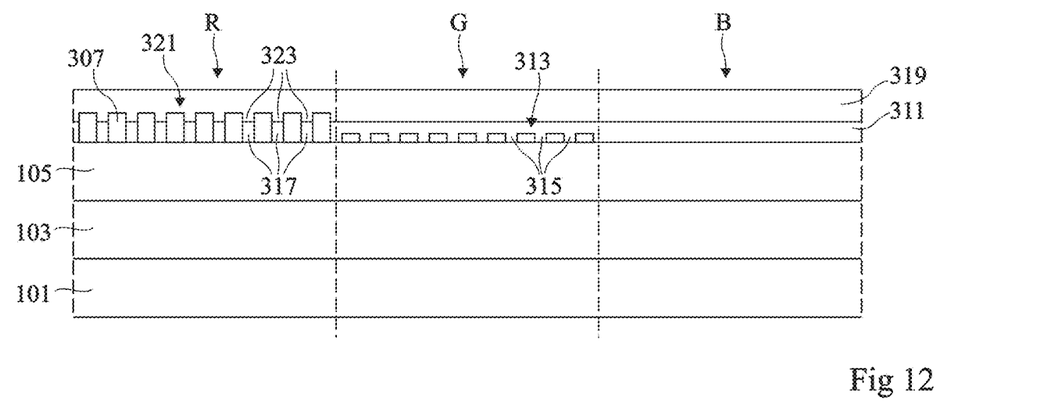
FIG. 12 illustrates a method of manufacturing a light-emitting display device according to a third embodiment.

FIG. 12 is a cross-section view illustrating steps of an example of a method of manufacturing a multi-color light-emitting display device according to a third embodiment.

The embodiment of FIG. 12 differs from the embodiment of FIGS. 7 to 11 in that, in the embodiment of FIG. 12, Mask 307 is thinned opposite the green pixels G of the device, and it totally removed opposite the blue pixels B of the device.

In the embodiment of FIG. 12, layers 311 and 319 are made of N-type doped semiconductor materials having different compositions, having different mesh parameters. More particularly, the material of layer 319 has a mesh parameter greater than that of the material of layer 311, which is itself greater than that of layer 105. Layer 311 is deposited across a thickness greater than the thickness of mask 307 opposite green pixels G, and smaller than the thickness of mask 307 opposite red pixels R. Layer 319 is deposited across a thickness greater than the height of the portions of the cavities 309 of mask 307 which are not filled with nanopillars 317 in the red pixels R of the device.

In this example, layer 105 is made of gallium nitride (GaN) and layers 311 and 319 are made of indium gallium nitride (InGaN). Due to the mesh parameter difference between the materials of layers 105 and 311, and due to the relatively low thickness of layer 311 with respect to layer 105, layer 311 is, on its upper surface side, relatively strongly strained opposite the blue B pixels of the device. In the green and red pixels G and R of the device, due to the presence of nanopillars on the lower surface side of layer 311, layer 311 is however relatively lightly strained or even relaxed on its upper surface side.

In the blue pixels B of the device, due to the relatively high strain of layer 311 on the mesh of layer 105, layer 319 is also relatively strongly strained on its upper surface side.

In the green pixels G of the device, due to the mesh parameter difference between the material of layer 311 and the material of layer 319, layer 319 has, on its upper surface side, a relatively high strain, smaller however than the strain of layer 319 in the blue pixels B of the device.

In the red pixels R of the device, due to the presence of nanostructures on the lower surface side of layer 319, at the interface with layer 311, layer 319 is relatively lightly strained (that is, less strained than in green pixels G) or even relaxed on its upper surface side.

The next steps of the display device manufacturing method (not detailed herein) are for example similar to what has been previously described. Similarly to what has been described in the example of FIGS. 7 to 11, due to the strain differences in the upper portion of layer 319 between the red, green, and blue pixels R, G, and B, the indium concentration in each InGaN layer of the active layer is not the same in the R, G, and B pixels. More particularly, a lower indium concentration is obtained in blue pixels B than in green pixels G, and in green pixels G than in red pixels R. This enables to obtain different emission wavelength ranges in the light-emitting cells of the different types of pixels. More particularly, in this example, the growth conditions of the active layer are selected to obtain an emission mainly in green in the light-emitting cells of pixels G, an emission mainly in blue in the light-emitting cells of pixels B, and an emission mainly in red in the light-emitting cells of pixels R.

Figure 13:
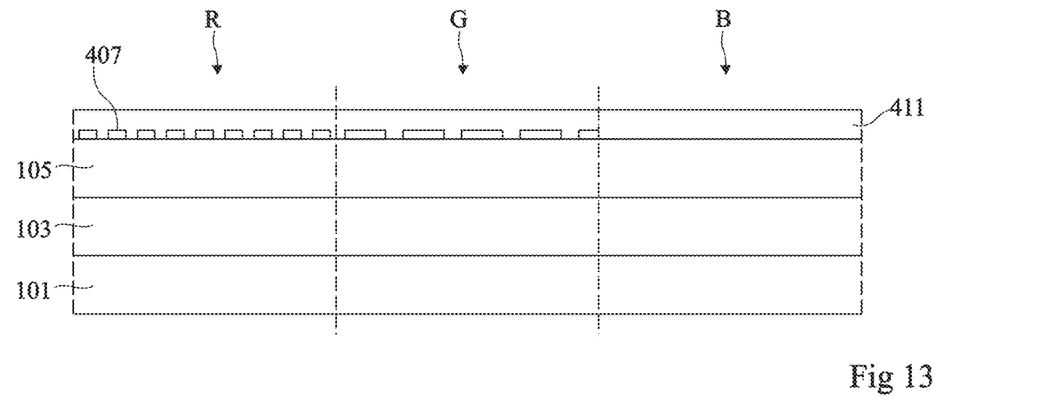
FIG. 13 illustrates a method of manufacturing a light-emitting display device according to a fourth embodiment.

FIG. 13 is a cross-section view illustrating steps of an example of a method of manufacturing a multi-color light-emitting device according to a fourth embodiment.

The embodiment of FIG. 13 differs from the previous embodiments in that, in the embodiment of FIG. 13, the masks 107 or 307 of the previous examples are replaced with a mask 407. Mask 407 comprises, opposite the red pixels R of the device, openings identical or similar to the openings 109 of the mask 107 of FIG. 1 or to the openings 309 of the mask 307 of FIG. 7. Mask 407 further comprises, opposite the green pixels G of the device, similar openings having greater dimensions, for example, a greater width, and optionally, a greater pitch than in red pixels R. In this example, the thickness of mask 407 is substantially the same opposite the red pixels R and opposite the green pixels G of the device. Mask 407 is further totally removed opposite the blue pixels B of the device.

In the embodiment of FIG. 13, after the forming of mask 407, a layer 411 of an N-type doped semiconductor material is deposited on the upper surface of the structure. During this step, the epitaxial growth is performed from the unmasked portions of the upper surface of layer 105. As in the previous embodiments, the epitaxy is performed simultaneously in all the pixels of the device. Layer 411 is deposited across a thickness greater than the thickness of mask 407 so that, opposite each red and green pixel R and G of the device, layer 411 comprises, in its upper portion, a coalesced layer 313 extending continuously over the entire surface of the light-emitting cell of the pixel.

The semiconductor material of layer 411 has a mesh parameter different from that of layer 105. In this example, layer 105 is made of gallium nitride (GaN) and layer 411 is made of indium gallium nitride (InGanN).

In the blue pixels B of the device, due to the mesh parameter difference between the materials of layers 105 and 411, layer 411 is relatively highly strained on its upper surface side.

In the red pixels R of the device, due to the presence of nanostructures on the lower surface side of layer 411, at the interface with layer 105, layer 411 is however relatively lightly strained or even relaxed on its upper surface side.

In the green pixels G of the device, due to the larger dimensions of the nanostructures on the lower surface side of layer 411, the strain of layer 411 is greater than the strain of layer 411 opposite red pixels R, but smaller than the strain of layer 411 opposite blue pixels B.

As in the examples of FIGS. 7 to 11 and 12, this enables to obtain an indium concentration lower in the active layer of the blue pixels B than in the active layer of the green pixels G, and lower in the active layer of the green pixels G than in the active layer of the red pixels R, and thus different emission wavelengths in the light-emitting cells of the different types of pixels. More particularly, in this example, the growth conditions of the active layer are selected to obtain an emission mainly in green in the light-emitting cells of pixels G, an emission mainly in blue in the light-emitting cells of pixels B, and an emission mainly in red in the light-emitting cells of pixels R.

Various embodiments and variants have been described. It will be understood by those skilled in the art that certain features of these various embodiments and variants may be combined, and other variants will occur to those skilled in the art. In particular, the described embodiments are not limited to the above-described embodiment of the insulating structures of the elementary light-emitting cells of the pixels, and of the connections between elementary light-emitting cells and a circuit for controlling the device.

Further, the described embodiments are not limited to the examples of materials and of dimensions indicated in the present disclosure.

Further, although preferred embodiments enabling to simultaneously form three types of pixels adapted to respectively emitting in blue, in green, and in red have been described, the described embodiments are not limited to this specific case. In particular, by varying the compositions of the semiconductor materials and/or the dimensions and/or the spacing of the openings of masks 107, 307, and/or 407, light-emitting cells emitting in other wavebands than those mentioned hereabove may be formed.

Further, to limit the strain and the risk of bowing of substrate 101 during the implementation of the different steps of deposition of the above-described method, trenches (not shown) delimiting the different pixels of the device may be etched in semiconductor layer 105, for example across the entire height of layer 105, before the forming of mask 107, 307, or 407.

It should further be noted that all the conductivity types of the above-described semiconductor layers may be inverted.

The invention claimed is:

1. Light-emitting device comprising first and second light-emitting cells adapted to respectively emitting in first and second wavelength ranges, wherein:
    each light-emitting cell comprises a stack of a first layer of a first semiconductor material and of a second layer of a second semiconductor material having a mesh parameter different from that of the first semiconductor material;
    in the first cell, the first layer is in contact with the second layer across the entire surface of the cell; and
    in the second cell, a mask provided with a plurality of through nano-openings regularly distributed across the entire surface of the cell forms an interface between the first layer and the second layer, the second layer comprising a plurality of nanopillars of the second semiconductor material arranged in the nano-openings of the mask, in contact, by a first surface, with the first layer, and a coalesced layer of the second semiconductor material in contact with a second surface of the nanopillars opposite to the first layer, extending across substantially the entire surface of the cell on the side of the mask opposite to the first layer,
    and wherein, in each cell, the second layer is topped with an active layer.

2. Device according to claim 1, wherein, in each cell, the first layer is doped with a first conductivity type, and the active layer is topped with a doped semiconductor layer of the second conductive type.

3. Device according to claim 1, wherein the first layer is made of gallium nitride and the second layer is made of indium gallium nitride.

4. Device according to claim 1, comprising a third light-emitting cell identical to the first cell, wherein the third cell is topped with a wavelength conversion element, and the first and second cells are not topped with wavelength conversion elements.

5. Device according to claim 1, further comprising a third light-emitting cell adapted to emitting in a third wavelength range, wherein:

the third light-emitting cell comprises a stack of a first layer of the first semiconductor material and of a second layer of the second semiconductor material;

in the third cell, a mask provided with a plurality of through nano-openings regularly distributed across the entire surface of the cell forms an interface between the first layer and the second layer;

the thickness of the mask is greater in the third cell than in the second cell; and the thickness of the second layer is greater than the thickness of the mask in the second cell and smaller than the thickness of the mask in the third cell.

6. Device according to claim 5, wherein each cell further comprises a third layer of a third semiconductor material topping the second layer, wherein:

in each of the first and second cells, the third layer is in contact with the second layer across substantially the entire surface of the cell; and in the first cell, the third layer comprises a plurality of nanopillars arranged in the nano-openings of the mask, in contact, by a first surface, with the second layer, and a coalesced layer of the material of the third layer in contact with a second surface of the nanopillars opposite to the second layer, extending across substantially the entire surface of the cell on the side of the mask opposite to the first layer.

7. Device according to claim 6, wherein the third semiconductor material has a mesh parameter difference with the second semiconductor material, the mesh parameter difference between the second semiconductor material and the third semiconductor material being greater than the mesh parameter difference between the first semiconductor material and the third semiconductor material.

8. Device according to claim 5, wherein the first, second, and third layers are respectively made of gallium nitride, of aluminum gallium nitride, and of indium gallium nitride.

9. Device according to claim 5, wherein the first, second, and third layers are respectively made of gallium nitride, of indium gallium nitride, and of indium gallium nitride, the compositions of the indium gallium nitride corresponding to the second layer and indium gallium nitride corresponding to the third layer being different.

10. Device according to claim 1, further comprising a third light-emitting cell adapted to emitting in a third wavelength range, wherein:

the third light-emitting cell comprises a stack of a first layer of the first semiconductor material and of a second layer of the second semiconductor material;

in the third cell, a mask provided with a plurality of through nano-openings distributed across the entire surface of the cell forms an interface between the first layer and the second layer; and the dimensions of the nano-openings of the mask are greater in the third cell than in the first cell.

11. Method of manufacturing a device according to claim 1, wherein the second layers of the different cells are simultaneously formed during a same epitaxy step.

12. Method of manufacturing a device according to claim 2, wherein the active layers of the different cells are simultaneously formed during a same epitaxy step.

* * * * *